United States Patent [19]

Fujikawa et al.

[11] Patent Number: 5,591,660

[45] Date of Patent: Jan. 7, 1997

[54] METHOD OF SELECTIVELY MANUFACTURING A SOLID STATE IMAGING DEVICE HAVING EITHER A REGULAR OR MIRROR IMAGE OUTPUT

[75] Inventors: Kazuhide Fujikawa; Eiji Komatsu, both of Kanagawa, Japan

[73] Assignee: Sony Corporation, Tokyo, Japan

[21] Appl. No.: 277,585

[22] Filed: Jul. 20, 1994

[30] Foreign Application Priority Data

Jul. 23, 1993 [JP] Japan .................................. 5-202875

[51] Int. Cl.⁶ ............................ H01L 21/70; H01L 27/00
[52] U.S. Cl. ............................................. 437/53; 348/311
[58] Field of Search ................................. 437/3, 50, 53; 348/311, 321, 322, 323, 304, 302; 257/231, 232, 241, 248

[56] References Cited

U.S. PATENT DOCUMENTS

| | | | |
|---|---|---|---|
| 3,932,775 | 1/1976 | Kosonocky | 307/311 |
| 4,016,598 | 4/1977 | Yamanaka | 257/231 |
| 4,280,141 | 7/1981 | McCann et al. | 348/316 |
| 4,603,426 | 7/1986 | Sauer | 377/60 |
| 4,680,637 | 7/1987 | Sugiki | 348/304 |
| 4,814,648 | 3/1989 | Hynecek | 307/497 |
| 5,038,369 | 8/1991 | Nishiki | 378/62 |
| 5,060,072 | 10/1991 | Hojo et al. | 358/213.11 |
| 5,249,055 | 9/1993 | Masuda et al. | 348/311 |
| 5,379,068 | 1/1995 | Hamasaki | 348/322 |

Primary Examiner—Mary Wilczewski
Assistant Examiner—Brian K. Dutton
Attorney, Agent, or Firm—Hill, Steadman & Simpson

[57] ABSTRACT

A solid state imaging device manufacturing process by which a solid state imaging device for a regular image and a solid state imaging device for a mirror image can be manufactured alternatively by a simple operation and a solid state imaging device which allows employment of an existing driving system as a driving system which includes a timing generator are disclosed. In manufacture, a solid state imaging device as an intermediate product is prepared first. The solid state imaging device includes an image section, a horizontal charge transfer section formed from a plurality of transfer electrodes having a fixed number of phases, and a pair of charge detection sections provided at the opposite ends of the horizontal charge transfer section. Then, the transfer electrodes are wired so that signal charge is transferred to one of the first and second charge detection sections in response to a clock signal thereby to complete one of a solid state imaging device for a regular image and another solid state imaging device for a mirror image.

6 Claims, 11 Drawing Sheets

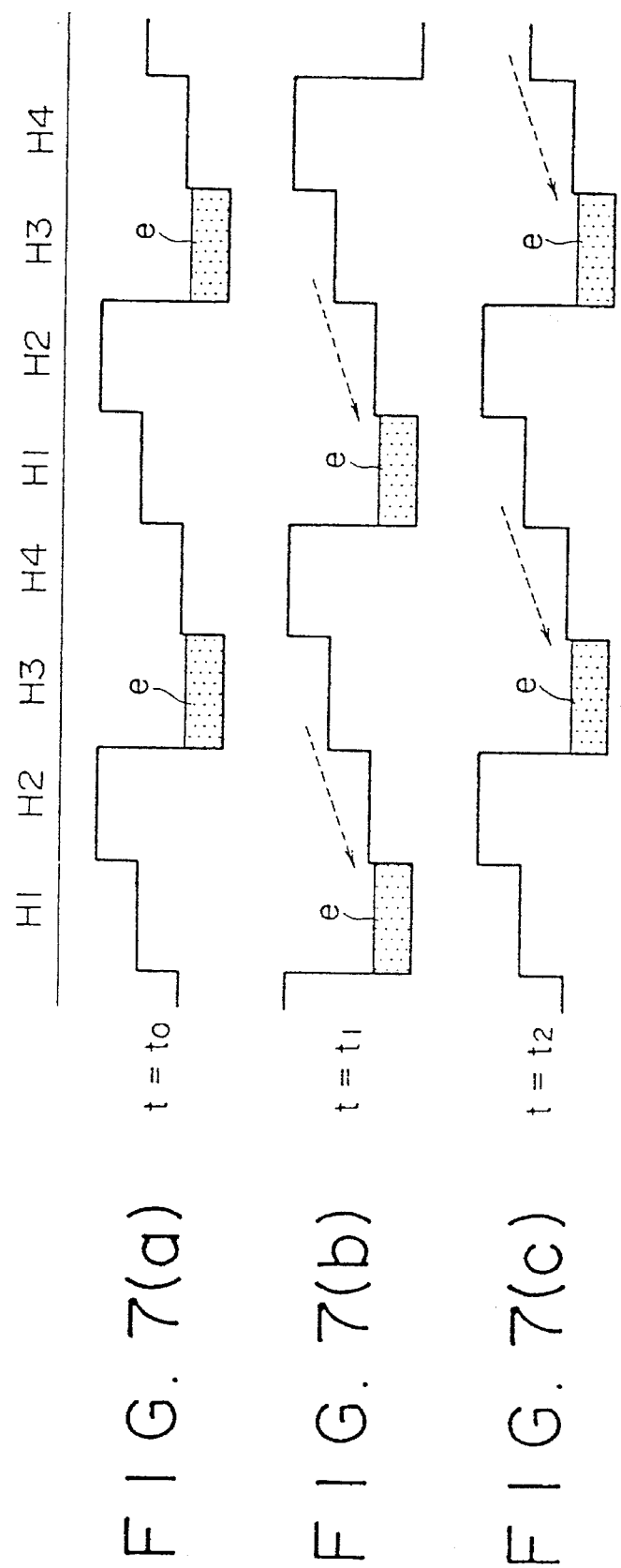

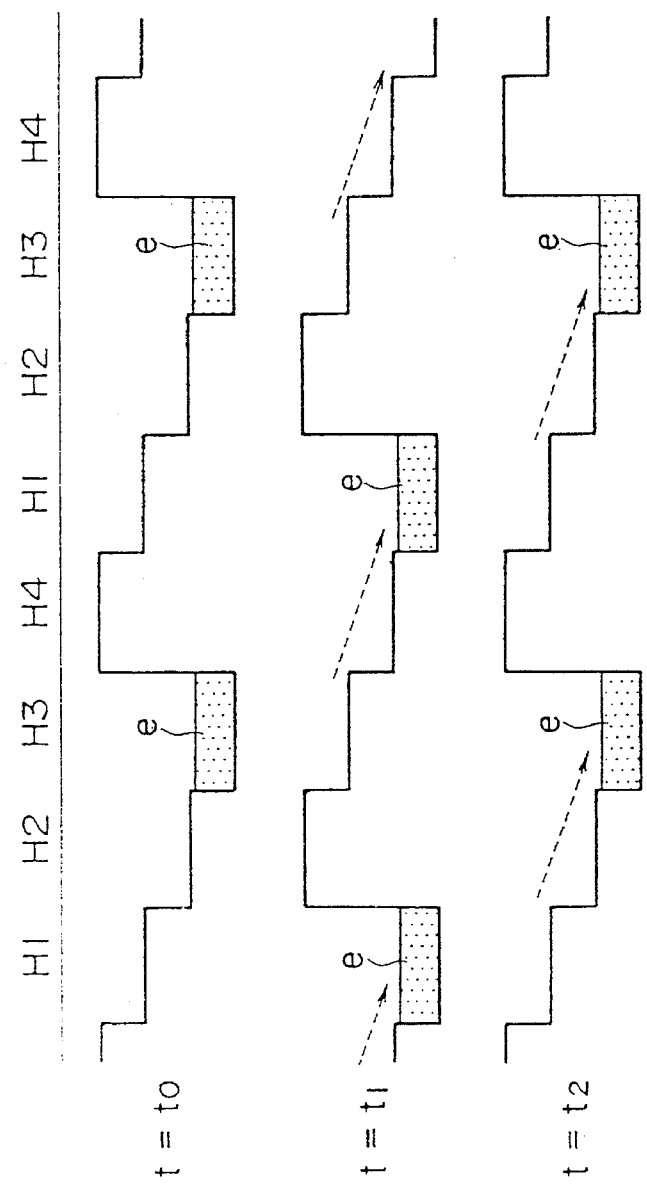

1 BIT TRANSFER SECTION

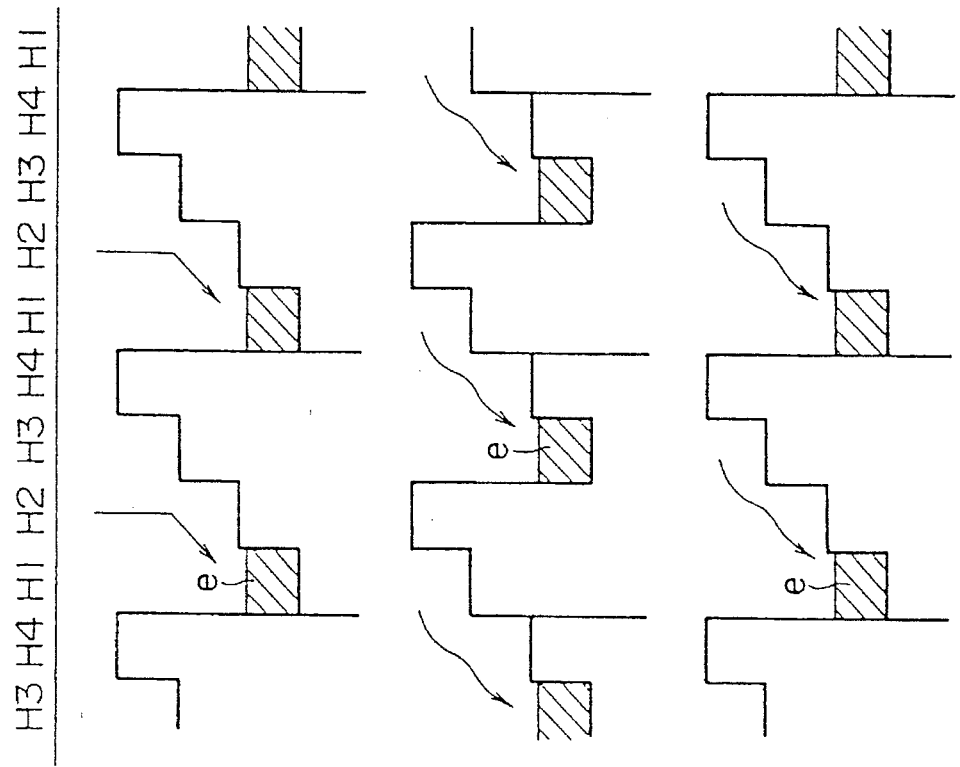
FIG. 14(a) RELATED ART  t = t0
FIG. 14(b) RELATED ART  t = t1
FIG. 14(c) RELATED ART  t = t2 t = t0 t = t1 t = t2

METHOD OF SELECTIVELY MANUFACTURING A SOLID STATE IMAGING DEVICE HAVING EITHER A REGULAR OR MIRROR IMAGE OUTPUT

BACKGROUND OF THE INVENTION

1. Field of the Invention

This invention relates to a solid state imaging device manufacturing process and a solid state imaging device, and, more particularly, the present invention relates to a solid state imaging device manufacturing process by which a solid state imaging device which is capable of outputting a mirror image can be manufactured and a solid resultant state imaging device manufactured by the solid state imaging device manufacturing method.

2. Description of the Related Art

Various solid state imaging devices are conventionally known, and one of such conventional solid state imaging devices is shown in FIG. 11(a). Referring to FIG. 11(a), the conventional solid state imaging device shown includes an imaging section 30, a horizontal charge transfer section 31 formed as a ring for horizontally transferring signal charge transferred thereto from the imaging section 30, a charge detection section 32 provided for the horizontal charge transfer section 31, and an output circuit section 33 provided for the horizontal charge transfer section 31. The transferring direction of the horizontal charge transfer section 31 is changed to lead out a regular image output or a mirror image output from a common output terminal 34.

Another conventional solid state imaging device is shown in FIG. 11(b). Referring to FIG. 11(b), the conventional solid state imaging device shown includes a horizontal charge transfer section 41, a pair of charge detection sections 42 and 43 provided at the opposite ends of the horizontal charge transfer section 41, and a pair of output circuit sections 44 and 45 provided on the opposite sides of the charge detection sections 42 and 43 remote from the horizontal charge transfer section 41. The solid state imaging device has a pair of output terminals 46 and 47 for a regular image and a mirror image.

With the conventional solid state imaging device described above with reference to FIG. 11(a), however, the length of the transfer route of signal charge upon outputting of a mirror image is equal to or greater than twice that upon outputting of a regular image, and consequently, the conventional solid state imaging device is disadvantageous in that transfer degradation upon outputting of a mirror image cannot be avoided. Besides, since two outputs of a regular image and a mirror image are allowed, a driving system for exclusive use is necessary for each of a regular image and a mirror image. Consequently, the solid state imaging device is disadvantageous also in that adjustment in phase of driving waveforms for horizontal transfer is very difficult.

Also with the conventional solid state imaging device described above with reference to FIG. 11(b), since outputs of a regular image and a mirror image are allowed, there is a drawback in that, similarly to the solid state imaging device of FIG. 11(a), driving systems for exclusive use for a regular image and a mirror image are necessitated.

Here, the construction and the transferring operation of the horizontal charge transfer section 41 of the solid state imaging device shown in FIG. 11(b) will be described.

The construction will first be described with reference to FIGS. 12(a) and 12(b). Four first to fourth electrodes H1 to H4 are formed successively and repetitively in one direction for each transfer section 51 for one bit on an upper face of a semiconductor substrate 51 with a gate insulating film 53 interposed therebetween. It is to be noted that each slanting line area in FIG. 12(a) denotes a channel stop.

The thickness of the gate insulating film 53 or the impurity concentration of the front face side of the substrate 51 is varied so that, when an equal potential is applied to the electrodes H1 to H4, potential wells formed below the first electrode H1 and the third electrode H3 may be deeper than potential wells formed below the second electrode H2 and the fourth electrode H4.

Four horizontal transfer clocks HΦ1 to HΦ4 generated from a timing generator not shown are supplied to the first to fourth electrodes H1 to H4, respectively. The four horizontal transfer clocks HΦ1 to HΦ4 are a combination of clocks of two phases. Accordingly, the horizontal charge transfer section 41 is driven by two phases to horizontally transfer signal charge.

Subsequently, the transferring operation in horizontal transfer of the horizontal charge transfer section 41 having the construction described above will be described.

First, transferring operation for obtaining a regular image signal will be described. In this instance, four horizontal transfer clocks HΦ1 to HΦ4 having such waveforms as shown in FIG. 13 are applied to the first to fourth electrodes H1 to H4, respectively.

When the time t is t=$t_0$, the horizontal transfer clocks HΦ1 and HΦ2 exhibit a high (H) level while the horizontal transfer clocks HΦ3 and HΦ4 exhibit a low (L) level. Consequently, the potentials below the electrodes exhibit such a distribution as seen in FIG. 14(a). In particular, referring to waveform in FIG. 14(a), the potentials exhibit a staircase distribution wherein the level decreases from the fourth electrode H4 in the leftward direction in FIGS. 14(a) to 14(c) toward the first electrode H1, and the potential well formed below the first electrode H1 is deepest. Consequently, signal charge e transferred from the imaging section 30 is accumulated below the first electrode H1.

When the time t is t=$t_1$, the horizontal transfer clocks HΦ1 and HΦ2 exhibit a low level while the horizontal transfer clocks HΦ3 and HΦ4 exhibit a high level. Consequently, the potentials below the electrodes exhibit such a staircase distribution as seen from the waveform in FIG. 14(b) wherein the level decreases from the second electrode H2 in the leftward direction in FIGS. 14(a) to 14(c) toward the third electrode H3, and the potential well formed below the third electrode H3 is deepest. Consequently, signal charge e is transferred from below the first electrode H1 to below the third electrode H3.

When the time t is t=$t_2$, the horizontal transfer clocks HΦ1 and HΦ2 exhibit a high level while the horizontal transfer clocks HΦ3 and HΦ4 exhibit a low level. Consequently, the potentials below the electrodes exhibit such a staircase distribution as seen from the waveform in FIG. 14(c) wherein the level decreases from the fourth electrode H4 in the leftward direction in FIGS. 14(a) to 14(c) toward the first electrode H1 again, and the potential well formed below the first electrode H1 is deepest. Consequently, signal charge e is transferred from below the third electrode H3 to below the first electrode H1.

In this manner, transfer of signal charge e takes place in the leftward direction in FIGS. 12(a) and 12(b) in the horizontal charge transfer section 41, and as a result, a regular image signal is led out.

Subsequently, operation for leading out a mirror image will be described. In this instance, four horizontal transfer clocks HΦ1 to HΦ4 having such waveforms as shown in FIG. 15 are applied to the first to fourth electrodes H1 to H4, respectively.

When the time t is t=t₀, the horizontal transfer clocks HΦ1 and HΦ4 exhibit a low level while the horizontal transfer clocks HΦ2 and HΦ3 exhibit a high level. Consequently, the potentials below the electrodes exhibit such a staircase distribution as seen from the waveform in FIG. 16(a) wherein the level decreases from the fourth electrode H4 in the right direction in FIGS. 16(a) to 16(c) toward the third electrode H3, and the potential well formed below the third electrode H3 is deepest. Consequently, signal charge e transferred from the imaging section 30 is accumulated below the third electrode H3.

When the time t is t=t₁, the horizontal transfer clocks HΦ1 and HΦ4 exhibit a high level while the horizontal transfer clocks HΦ2 and HΦ3 exhibit a low level. Consequently, the potentials below the electrodes exhibit such a staircase distribution as seen from the waveform in FIG. 16(b) wherein the level decreases from the second electrode H2 in the rightward direction in FIGS. 16(a) to 16(c) toward the first electrode H1, and the potential well formed below the first electrode H1 is deepest. Consequently, signal charge e is transferred from below the third electrode H3 to below the first electrode H1.

When the time t is t=t₂, the horizontal transfer clocks HΦ1 and HΦ4 exhibit a low level while the horizontal transfer clocks HΦ2 and HΦ3 exhibit a high level. Consequently, the potentials below the electrodes exhibit such a staircase distribution as seen from the waveform in FIG. 16(c) wherein the level decreases from the fourth electrode H4 in the rightward direction in FIGS. 16(a) to 16(c) toward the third electrode H3 again, and the potential well formed below the third electrode H3 is deepest. Consequently, signal charge e is transferred from below the first electrode H1 to below the third electrode H3.

In this manner, transfer of signal charge e takes place in the rightward direction in FIGS. 12(a) and 12(b) in the horizontal charge transfer section 41, and as a result, a mirror image signal is led out.

As described above, with the conventional solid state imaging device shown in FIG. 11(b), the phases of the horizontal transfer clocks HΦ1 to HΦ4 to be applied to the first to fourth electrodes Hi to H4 are changed to reverse the transferring direction in the horizontal charge transfer section 41 to lead out either one of a regular image output and a mirror image output. Accordingly, although the horizontal charge transfer section 41 is driven in two phases, a timing generator which can generate four horizontal transfer clocks HΦ1 to HΦ4 is necessitated. Consequently, an existing driving circuit cannot be employed as it is as a driving circuit which includes such timing generator. Besides, driving systems for exclusive use for a regular image and a mirror image must be provided separately.

SUMMARY OF THE INVENTION

It is an object of the present invention to provide a solid state imaging device manufacturing process by which a solid state imaging device for a regular image and a solid state imaging device for a mirror image can be manufactured alternatively by a simple operation.

It is another object of the present invention to provide a solid state imaging device which allows employment of an existing driving system as a driving system which includes a timing generator.

In order to attain the objects described above, according to an aspect of the present invention, there is provided a process of manufacturing a solid state imaging device, which comprises the steps of preparing a solid state imaging device including an image section having a photoelectric transducer section in which a plurality of photoelectric transducer elements are arranged linearly, a horizontal charge transfer section formed from a plurality of transfer electrodes having a fixed number of phases for horizontally transferring signal charge transferred thereto from the imaging section, and first and second charge detection sections provided at the opposite ends of the horizontal charge transfer section for detecting signal charge horizontally transferred in the horizontal charge transfer section to output a regular image signal and a mirror image signal, respectively, and wiring the transfer electrodes so that signal charge is transferred to one of the first and second charge detection sections in response to a clock signal for driving the horizontal charge transfer section thereby to manufacture one of a solid state imaging device for a regular image and another solid state imaging device for a mirror image.

In the manufacturing process, at the first preparing step, intermediate products can be prepared commonly for solid state imaging devices for a regular image and solid state imaging devices for a mirror image. Such intermediate products are advantageous in stock control. Then, at the wiring step, the transfer electrodes are connected differently between solid state imaging devices for a regular image and solid state imaging devices for a mirror image. Consequently, solid state imaging devices for a regular image and solid state imaging devices for a mirror image can be alternatively manufactured only by changing the wiring pattern for the transfer electrodes.

With a solid state imaging device for a regular image and another solid state imaging device for a mirror image manufactured in accordance with the manufacturing process, a regular image output and a mirror image output can be led out as signals of a same format. Accordingly, charge transfer of the horizontal charge transfer section is performed in response to same two-phase horizontal transfer clocks whether a regular image or a mirror image is to be outputted. Consequently, an existing driving system including a timing generator can be used as it is as a driving system for the horizontal charge transfer section whether the horizontal charge transfer section is used to output a regular image or mirror image.

According to another aspect of the present invention, there is provided a solid state imaging device, which comprises an imaging section including a plurality of photoelectric transducer devices arranged in a matrix, and a plurality of vertical charge transfer sections disposed between adjacent columns of the photoelectric transducer devices, a horizontal charge transfer section for horizontally transferring signal charge transferred thereto from the imaging section, first and second charge detection sections provided at the opposite ends of the horizontal charge transfer section for detecting signal charge to output a regular image and a mirror image, respectively, and a plurality of pad elements for inputting, to the horizontal charge transfer section, horizontal transfer clock signals for driving the horizontal charge transfer section, the pad elements being connected so as to output signal charge to one of the first and second charge detection sections.

The above and other objects, features and advantages of the present invention will become apparent the following description and the appended claims, taken in conjunction with the accompanying drawings in which like parts or elements are denoted by like reference characters.

BRIEF DESCRIPTION OF THE DRAWINGS

FIGS. 7(a) to 7(c) are potential diagrams illustrating a transferring operation of the horizontal charge transfer section shown in FIG. 2 when a regular image is to be outputted;

FIGS. 9(a) to 9(c) are potential diagrams illustrating a transferring operation of the horizontal charge transfer section shown in FIG. 2 when a mirror image is to be outputted;

FIGS. 14(a) to 14(c) are potential diagrams illustrating transferring operation of the conventional solid state imaging device shown in FIG. 11(b) when a regular image is to be outputted;

DESCRIPTION OF THE PREFERRED EMBODIMENTS

Figure 1:
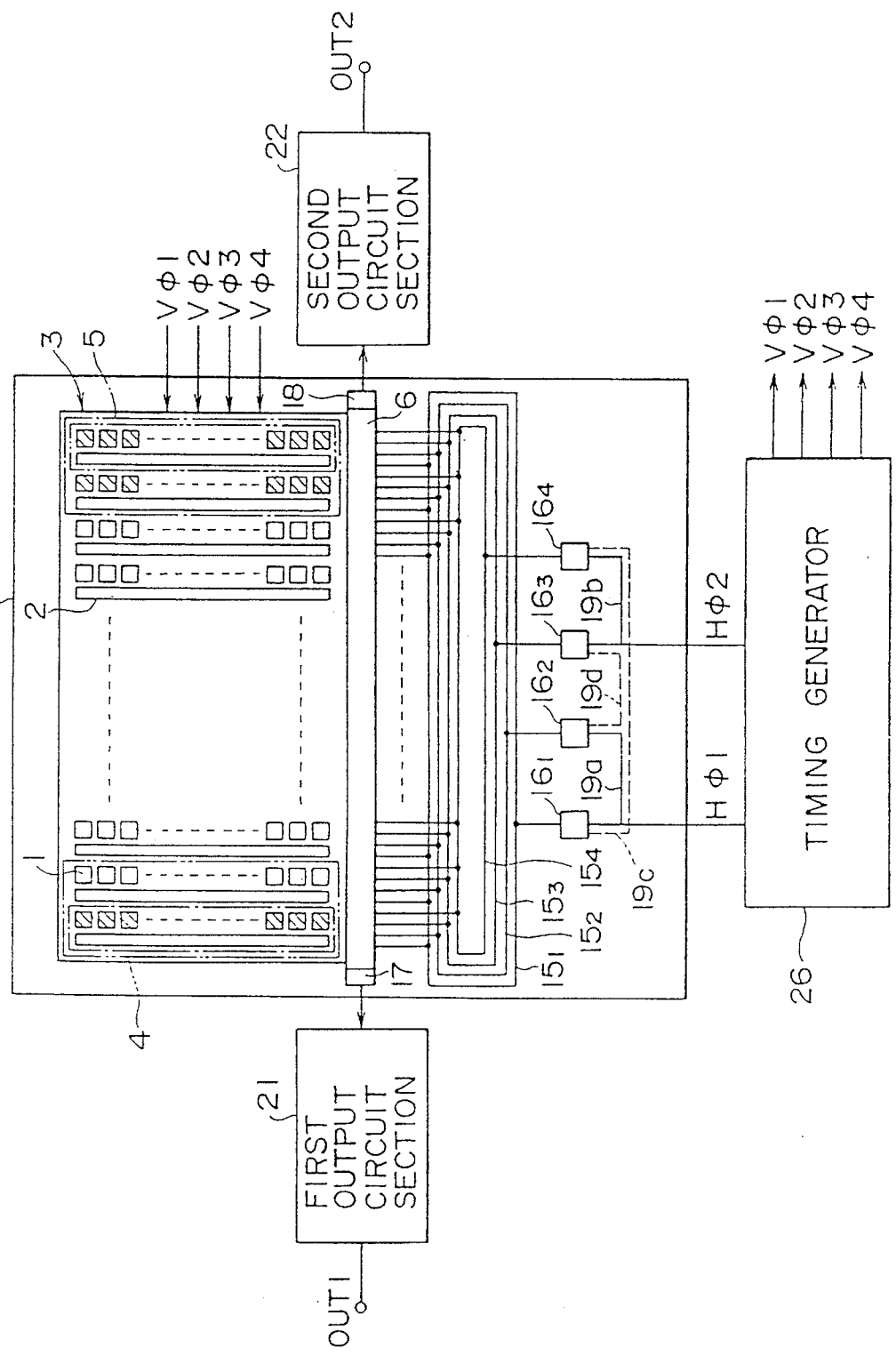
FIG. 1 is a diagrammatic view of a solid state imaging device showing a preferred embodiment of the present invention.

Referring first to FIG. 1, there is shown a general construction of a solid state imaging device to which the present invention is applied. In the present embodiment, the present invention is applied to a CCD (charge coupled device) solid state imaging device for obtaining a regular image output.

The solid state imaging device includes an imaging section 3 which includes a large number of photosensors (photoelectric transducer section) 1 arranged two-dimensionally in a matrix to construct picture elements for converting incident light into signal charge and accumulating the signal charge and a plurality of vertical charge transfer sections 2 disposed corresponding to the columns of the photosensors 1.

The vertical charge transfer sections 2 are driven by four-phase vertical transfer clocks VΦ1 to VΦ4 to vertically transfer signal charge read out in units of a picture element from the photosensors 1.

The imaging section 3 is constructed such that predetermined areas at peripheral portions thereof serve as OPB (optical black) areas in which light to the photosensors 1 is intercepted while the other area except the OPB areas serves as an effective picture element area and signal charge of picture elements (indicated by slanting lines in FIG. 1) within the effective picture element area is used as imaging information. Accordingly, the resolutions in the horizontal direction and the vertical direction depend upon the numbers of picture elements in the effective picture element area in the directions.

It is to be noted that, while only first and second OPB areas 4 and 5 on the opposite left and right sides of the imaging section 3 are shown for convenience of illustration and description, OPB areas are present also on the upper side and the lower side of the imaging section 3 as described above.

When it is tried to lead out a regular image output, the black signal level of picture element information, for example, of the second OPB area 5 on the right side from among the OPB areas of the imaging section 3 is used as a reference level for signal processing for each picture element signal of the effective picture element area.

Since the black signal level of the second OPB area 5 is used as a reference level in order to obtain a regular image output, the black signal level information is outputted subsequently on the time base to each picture element signal of the effective picture element area.

Further, since black signal levels for a particular fixed number of picture elements are necessary in order to obtain the reference level, the number N1 of picture elements of the second OPB area 5 in the horizontal direction is set greater than the number N1 of picture elements N1 of the first OPB area 4. It is to be noted that the device wherein N1=1 and N2=2 is shown in FIG. 1 for convenience of illustration and description.

A horizontal charge transfer section 6 for horizontally transferring signal charge transferred thereto from the vertical charge transfer sections 2 is provided on the output sides of the vertical charge transfer sections 2.

Figure 2:
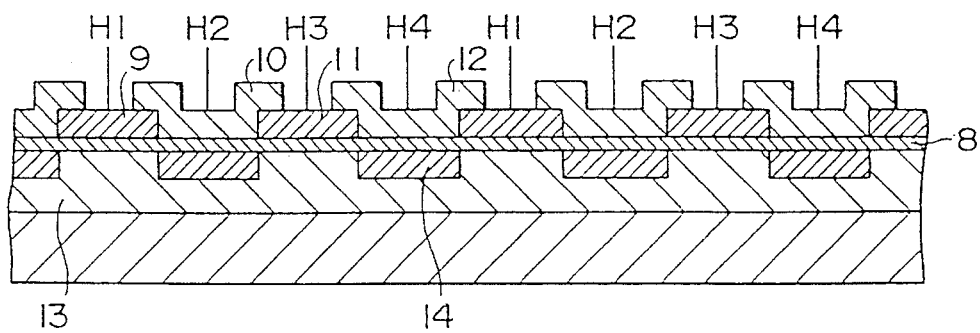
FIG. 2 is a schematic sectional view showing the structure of a horizontal charge transfer section of the solid state imaging device shown in FIG. 1.

Referring now to FIG. 2, the horizontal charge transfer section 6 includes, in units of one bit, first to fourth (H1 to H4) electrodes 9 to 12 made of polycrystalline silicon and formed in a two-layer structure on an upper face of a semiconductor substrate 7 with a gate insulating film 8 interposed therebetween.

In addition to a charge transfer well section 13, transfer barrier portions 14 are formed by varying the impurity concentration on the front surface of the substrate 7 below the second and fourth electrodes 10 and 12 of the second layer from among the first to fourth electrodes 9 to 12. The transfer barrier portions 14 are constructed such that potential wells formed below the second and fourth electrodes 10 and 12 when an equal potential is applied to the first to fourth electrodes 9 to 12 are shallower than potential wells formed below the first and third electrodes 9 and 11.

Figure 3:
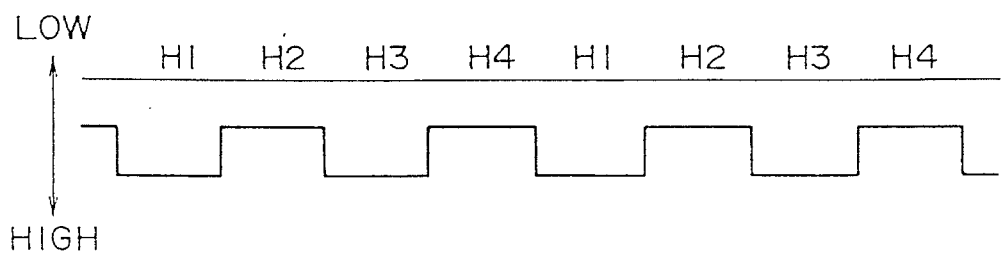
FIG. 3 is a diagrammatic view illustrating a potential profile of the horizontal charge transfer section shown in FIG. 2 when an equal potential is applied to electrodes of the same.

FIG. 3 illustrates a potential profile when an equal potential is applied to the first to fourth electrodes 9 to 12 in the horizontal charge potential section 6. As apparently seen from FIG. 3, the potentials at the second and fourth electrodes 10 and 12 are lower than those at the first and third electrodes 9 and 11.

It is to be noted that, while, in the solid state imaging device shown, the impurity concentration of the front face side of the substrate 7 is varied in order to make potential wells formed below the second and fourth electrodes 10 and 12 shallower than potential wells formed below the first and third electrodes 9 and 11, a similar potential distribution can be obtained alternatively by varying the thickness of the gate insulating film 8.

The first to fourth electrodes 9 to 12 are connected in a corresponding relationship to four bus lines $15_1$ to $15_4$ each formed, for example, in a loop. The four bus lines $15_1$ to $15_4$ are connected in a corresponding relationship to four pads $16_1$ to $16_4$.

The pads $16_1$ and $16_2$ and the pads $16_3$ and $16_4$ are individually paired with each other and electrically connected to each other by way of a pair of wiring patters $19a$ and $19b$, respectively.

As two-phase horizontal transfer clocks HΦ1 and HΦ2 are individually applied to the two pad pairs, the horizontal charge transfer section 6 horizontally transfers signal charge in the leftward direction in FIG. 1 by two-phase driving.

A first charge detection section 17, for example, of a floating diffusion amplification construction is provided at the left end of the horizontal charge transfer section 6 and detects signal charge transferred thereto by the horizontal charge transfer section 6.

A CCD solid state transfer section 20 which can output a regular image is constituted from those elements described above. The CCD solid state imaging device 20 is of an ordinary type wherein the horizontal charge transfer section 6 is driven by two-phase horizontal transfer clocks HΦ1 and HΦ2. Accordingly, an existing driving system can be used as it is as a driving system which includes a timing generator 26, which will be hereinafter described, which generates such two-phase horizontal transfer clocks HΦ1 and HΦ2.

The CCD solid state imaging device 20 further includes a second charge detection section 18, for example, of a floating diffusion amplifier construction similarly provided on the right side of the horizontal transfer section 6 so that a mirror image output may be obtained.

In order to obtain a mirror image output, signal charge must be transferred horizontally in the rightward direction in FIG. 1. In order for the CCD solid state imaging device 20 to act as a solid state imaging device for a mirror image, the pads $16_1$ and $16_4$ and the pads 162 and 163 are individually paired with each other and are electrically connected to each other by way of a pair of wiring patterns $19c$ and $19d$, respectively, as indicated by broken lines in FIG. 1 and two-phase horizontal transfer clocks HΦ1 and HΦ2 are applied to the two pad pairs.

By the way, as described hereinabove, in order to obtain a regular image output, the black signal level of the second OPB area 5 on the right side of the imaging section 3 is used as a reference level. For symmetry, in order to obtain a mirror image output, the black signal level of the first OPB area 4 on the left side of the imaging section 3 must be used as a reference level.

Accordingly, in order to obtain a mirror image output, the number N1 of picture elements of the first OPB area 4 in the horizontal direction is set greater than the number N2 of picture elements of the second OPB area 5.

Consequently, also when a mirror image output is obtained, black signal level information of the first OPB area 4 is outputted subsequently on the time base to each picture element signal of the effective picture element area. In other words, a regular image output and a mirror image output are outputted as signals having a same format.

Thus, in the present invention, a solid state imaging device for a regular image and another solid state imaging device for a mirror image are designed as a same solid state imaging device, and at an intermediate stage of the manufacturing process, the combination of connections of the four pads $16_1$ to $16_4$ is changed to change the connection condition corresponding to two-phase driving of the first to fourth electrodes 9 to 12 and change the numbers of picture elements of the first and second OPB areas 4 and 5 in the horizontal direction to the opposite relationship to each other.

In particular, when it is intended to manufacture a solid state imaging device for a regular image, the wiring patters $19a$ and $19b$ are formed such that the pads $16_1$ and $16_2$ and the pads $16_3$ and $16_4$ of the four pads $16_1$ to $16_4$ are individually connected to each other, and the light interception film (not shown) is formed such that the number of picture elements of the second OPB area 5 in the horizontal direction is greater than that of the first OPB area 4.

On the other hand, when it is intended to manufacture a solid state imaging device for a mirror image, the wiring patterns $19c$ and $19d$ are formed such that the pads $16_1$ and $16_4$ and the pads $16_2$ and $16_3$ of the four pads $16_1$ to $16_4$ are individually connected to each other, and the light interception film (not shown) is formed such that the number of picture elements of the first OPB area 4 in the horizontal direction is greater than that of the second OPB area 5.

It is to be noted that, since the wiring patterns $19a$ to $19d$ which interconnect the four pads $16_1$ to $16_4$ and the light interception film of the first and second OPB areas 4 and 5 are formed as a same layer from aluminum, the change of the combination of connections of the four pads $16_1$ to $16_4$ and the change of the number of picture elements in the horizontal direction of the first and second OPB areas 4 and 5 can be realized at a time at a same step in the manufacturing process.

Since the wiring patterns $19a$ to $19d$ which interconnect the four pads $16_1$ to $16_4$ are changed and the numbers of picture elements of the first and second OPB areas 4 and 5 in the horizontal direction are changed during an intermediate stage of the process of manufacturing a solid state imaging device in this manner to select between the manufacture of an article for a regular image output and another article for a mirror image output, intermediate products up to the step preceding to the changing step can be manufactured as same articles in advance. This is very advantageous in terms of stock control.

Further, since the change of the wiring patterns $19a$ to $19d$ and the change of the numbers of picture elements of the OPB areas 4 and 5 can be realized at a time at a same step, the number of masks to be used can be reduced to one half compared with that where solid state imaging devices for a regular image and solid state imaging devices for a mirror image are manufactured quite separately from each other.

It is to be noted that, in order to obtain a solid state imaging device for imaging a color image, also arrays of color filters arranged in units of a picture element should be made different between an article for a regular image output and another article for a mirror image output.

Referring back to FIG. 1, detection outputs of the first and second charge detection sections 17 and 18 are amplified by first and second output circuit sections 21 and 22, respectively, disposed as external circuits on the opposite sides of the horizontal charge transfer section 6, and are led out as a regular image output OUT1 and a mirror image output OUT2.

Figure 4:
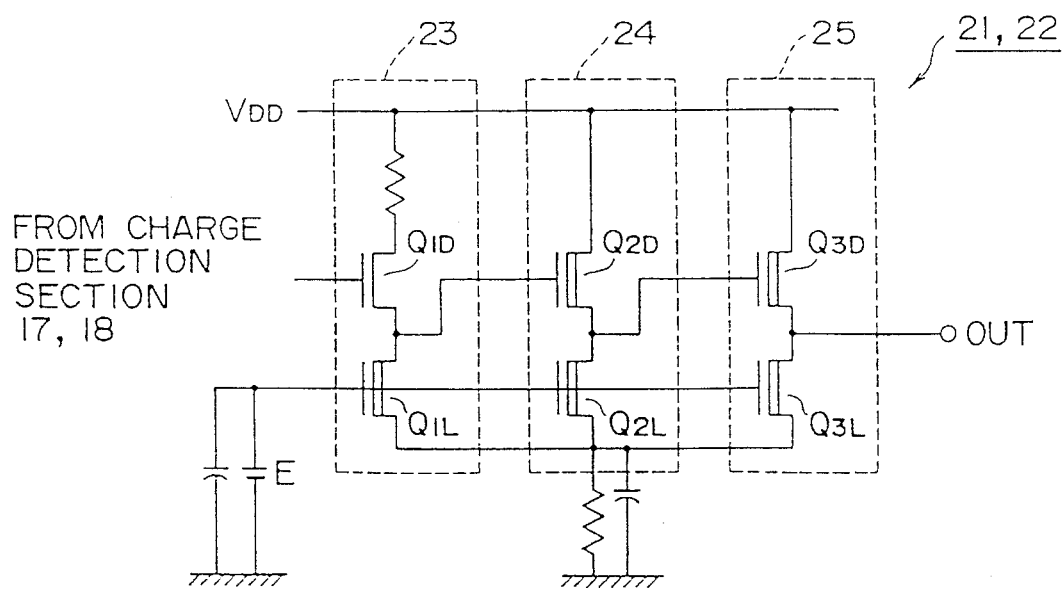
FIG. 4 is a circuit diagram showing an exemplary circuit construction of an output circuit section of the solid state imaging device shown in FIG. 1.

Referring now to FIG. 4, the first and second output circuit sections 21 and 22 are each constituted, for example, from three stages of source follower circuits 24 to 26 constituted from driving side MOS transistors QnD and load side MOS transistors $Q_{nL}$.

In each of the first and second output circuit sections 21 and 22, signal charge detected by the first or second charge detection section 17 or 18 is applied to the gate of the driving side MOS transistor $Q_{1D}$ of the source follower circuit 23 at the first stage. Meanwhile, the gates of the load side MOS transistors $Q_{1L}$, $Q_{2L}$ and $Q_{3L}$ at the three stages are biased commonly by a dc power source E.

In order to drive the vertical charge transfer sections 2, the horizontal charge transfer section 6 and so forth of the solid state imaging device 20, a timing generator 26 for generating various timing signals such as the four-phase vertical transfer clocks VΦ1 to VΦ4 and the two-phase horizontal transfer clocks HΦ1 and HΦ2 is provided as an external circuit.

By the way, since a regular image output and a mirror image output are led out as signals of a same format by changing the combination of connections of the four pads $16_1$ to $16_4$ and the numbers of picture elements of the first and second OPB areas 4 and 5 and changing the charge transferring direction of the horizontal charge transfer section 6 as described hereinabove, horizontal transfer clocks HΦ1 and HΦ2 of quite same timings can be used for both of a regular image output and a mirror image output. Accordingly, the single timing generator 26 can be used commonly for a solid state imaging device for a regular image and another solid state imaging device for a mirror image, and besides, an existing timing generator can be used for the timing generator 26.

Figure 5:
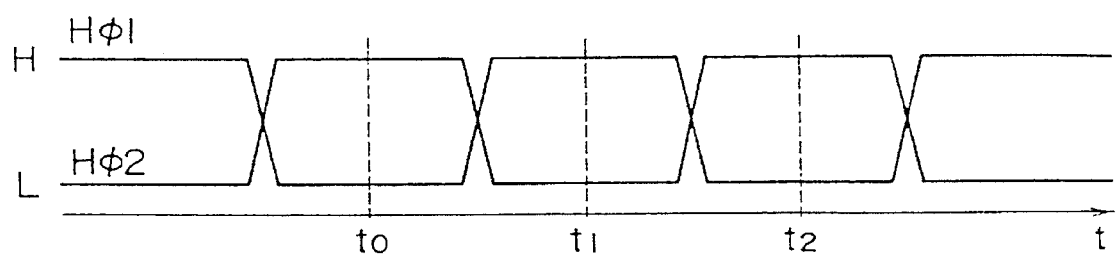
FIG. 5 is a waveform diagram showing waveforms of two-phase horizontal transfer clocks to the horizontal charge transfer section shown in FIG. 2.

Subsequently, transferring operations of the horizontal charge transfer section 6 upon regular image outputting and mirror image outputting when the horizontal transfer clocks HΦ1 and HΦ2 of such waveforms as shown in FIG. 5 are applied will be described.

Figure 6:
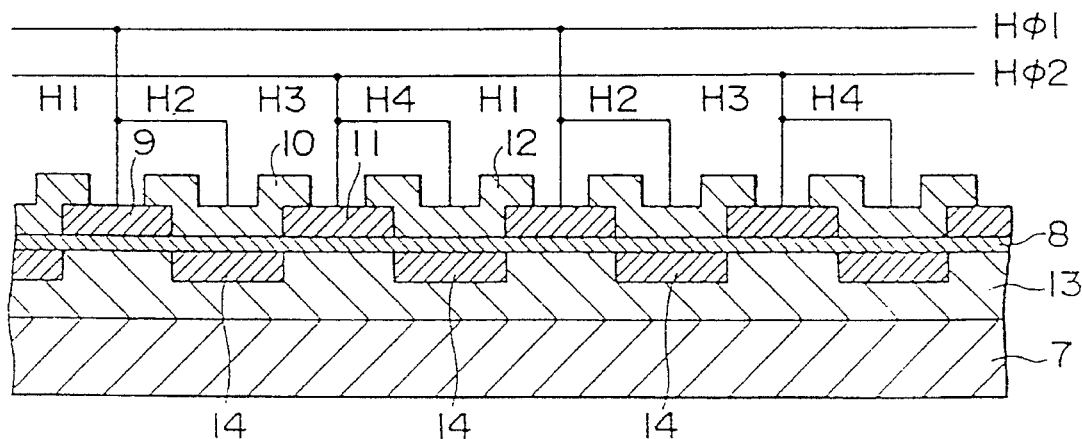
FIG. 6 is a wiring diagram of the electrodes of the horizontal charge transfer section shown in FIG. 2 when a regular image is to be outputted.

In order to lead out a regular image Output, the horizontal transfer clock HΦ1 is applied to the first and second electrodes (H1, H2) 9 and 10 while the horizontal transfer clock HΦ2 is applied to the third and fourth electrodes (H3, H4) 11 and 12 as seen from FIG. 6.

When the time t is t=$t_0$, the horizontal transfer clock HΦ1 exhibits a low level while the horizontal transfer clock HΦ2 exhibits a high level. Consequently, the potentials below the electrodes exhibit such a staircase distribution as seen from the waveform in FIG. 7(a) wherein the level decreases from the second electrode (H2) 10 in the leftward direction in FIGS. 7(a) to 7(c) toward the third (H3) electrode 11, and the potential well formed below the third electrode (H3) 11 is deepest. Consequently, signal charge e transferred from the imaging section 3 is accumulated below the third electrode (H3) 11.

When the time t is t=$t_1$, the horizontal transfer clock HΦ1 exhibits a high level while the horizontal transfer clock HΦ2 exhibits a low level. Consequently, the potentials below the electrodes exhibit such a staircase distribution as seen from the waveform in FIG. 7(b) wherein the level decreases from the fourth electrode (H4) 12 in the leftward direction in FIGS. 7(a) to 7(c) toward the first (H1) electrode 9, and the potential well formed below the first electrode (H1) 9 is deepest. Consequently, signal charge e is transferred from below the third electrode (H3) 11 to below the first electrode (H1) 9.

When the time t is t=$t_2$, the horizontal transfer clock HΦ1 exhibits a low level while the horizontal transfer clock HΦ2 exhibits a high level. Consequently, the potentials below the electrodes exhibit such a staircase distribution as seen from the waveform in FIG. 7(c) again wherein the level decreases from the second electrode (H2) 10 in the leftward direction in FIGS. 7(a) to 7(c) toward the third electrode (H3) 11 again, and the potential well formed below the third electrode (H3) 11 is deepest. Consequently, signal charge e is transferred from below the first electrode (H1) 9 to below the third electrode (H3) 11.

In this manner, transfer of signal charge e takes place in the leftward direction in FIG. 1 in the horizontal charge transfer section 6, and as a result, a regular image signal is led out.

Figure 8:
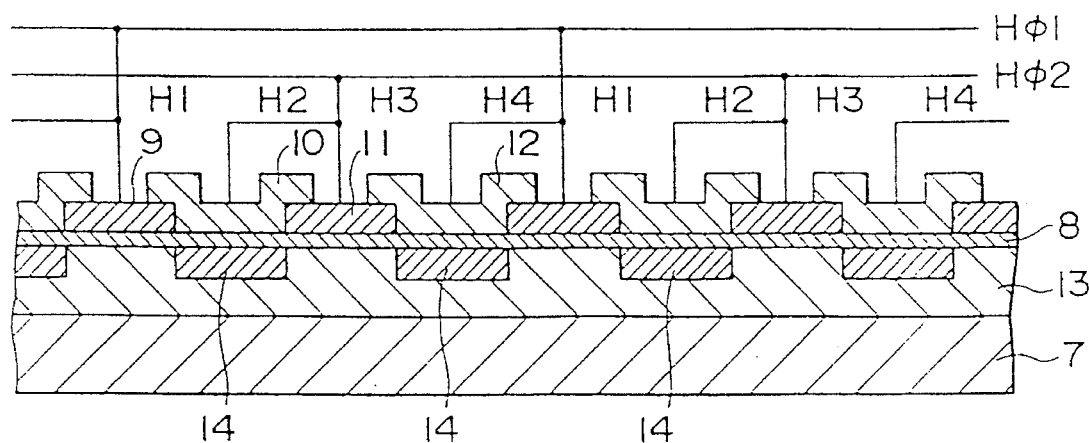
FIG. 8 is a wiring diagram of the electrodes of the horizontal charge transfer section shown in FIG. 2 when a mirror image is to be outputted.

On the other hand, in order to obtain a mirror image output, the horizontal transfer clock HΦ1 is applied to the first and fourth electrodes (H1, H4) 9 and 12 while the horizontal transfer clock HΦ2 is applied to the second and third electrodes (H2, H3) 10 and 11 as seen from FIG. 8.

When the time t is t=$t_0$, the potentials of the charge transfer well section 13 exhibit such a staircase distribution as seen from the waveform in FIG. 9(a) wherein the level decreases from the fourth electrode (H4) 12 in the rightward direction in FIGS. 9(a) to 9(c) toward the third electrode (H3) 11, and the potential well formed below the third electrode (H3) 11 is deepest. Consequently, signal charge e transferred from the imaging section 3 is accumulated below the third electrode (H3) 11.

When the time t is t=$t_1$, the potentials of the charge transfer well section 13 exhibit such a staircase distribution as seen from the waveform in FIG. 9(b) wherein the level decreases from the second electrode (H2) 10 in the rightward direction in FIGS. 9(a) to 9(c) toward the first electrode (H1) 9, and the potential well formed below the first electrode (H1) 9 is deepest. Consequently, signal charge e is transferred from below the third electrode (H3) 11 to below the first electrode (H1) 9. Then, when the time t is t=$t_2$, the potentials of the charge transfer well section 13 exhibit such a staircase distribution as seen from the waveform in FIG. 9(c) again wherein the level decreases from the fourth electrode (H4) 10 in the rightward direction in FIGS. 9(a) to 9(c) toward the third electrode (H3) 11 again, and the potential well formed below the third electrode (H3) 11 is deepest. Consequently, signal charge e is transferred from below the first electrode (H1) 9 to below the third electrode (H3) 11.

In this manner, transfer of signal charge e takes place in the rightward direction in FIG. 1, and as a result, a mirror image signal is led out.

Figure 10A:
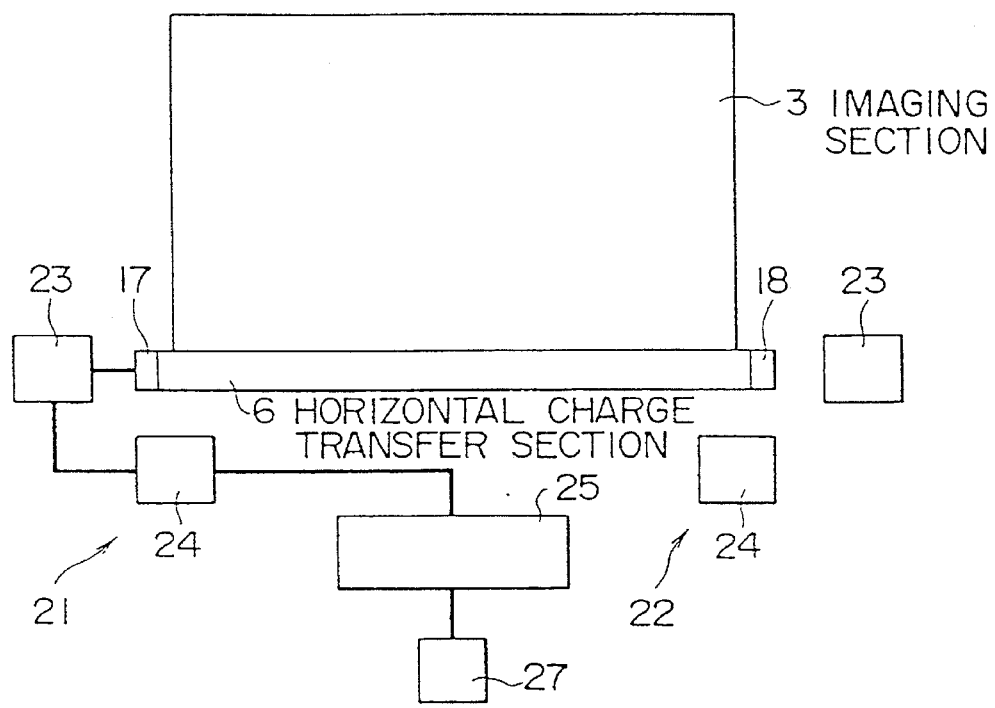
FIG. 10(a) is a diagrammatic view of another solid state imaging device constructed so as to output a regular image showing a second preferred embodiment of the present invention.
Figure 10B:
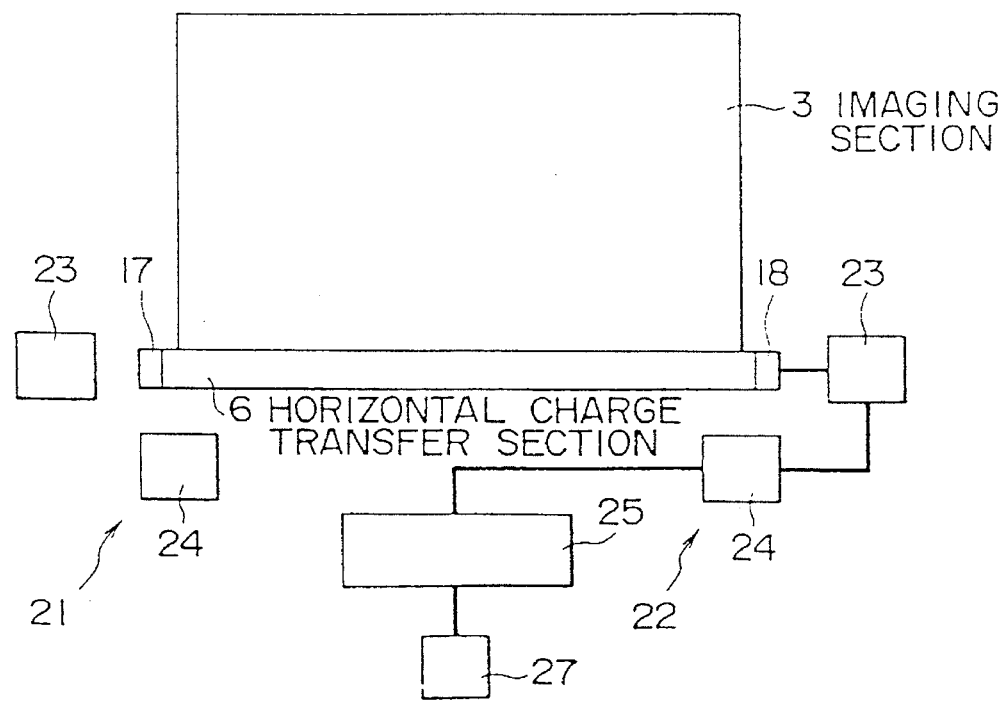
FIG. 10(b) is a similar view but showing a modification to the solid stage imaging device of FIG. 10(a) constructed so as to output a mirror image.
Figure 11A:
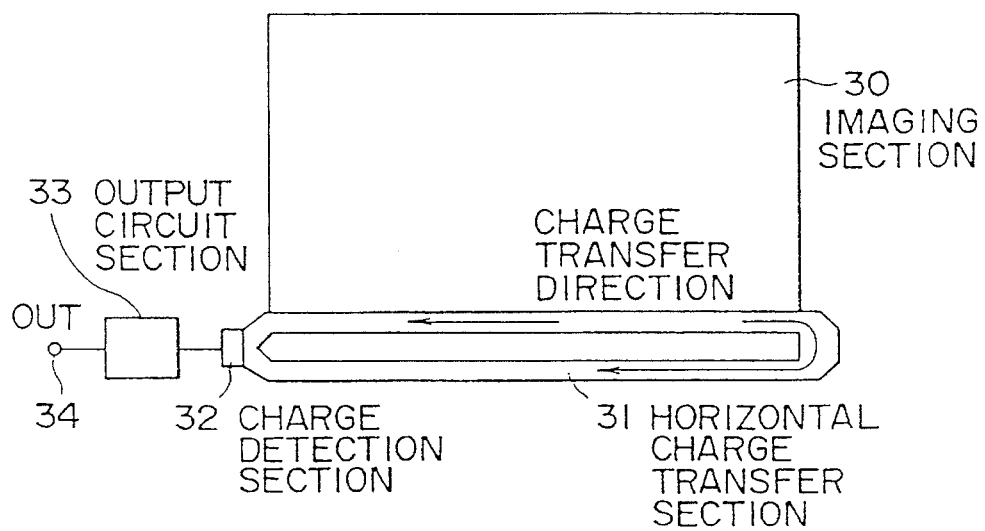
FIGS. 11(a) and 11(b) are diagrammatic views showing different conventional solid state imaging device.
Figure 11B:
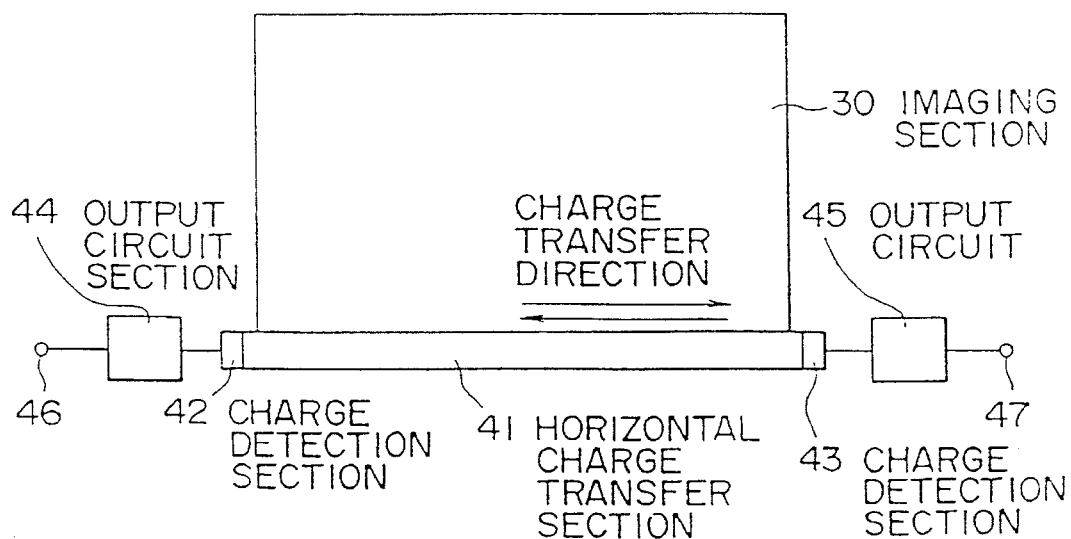
Figure 12A:
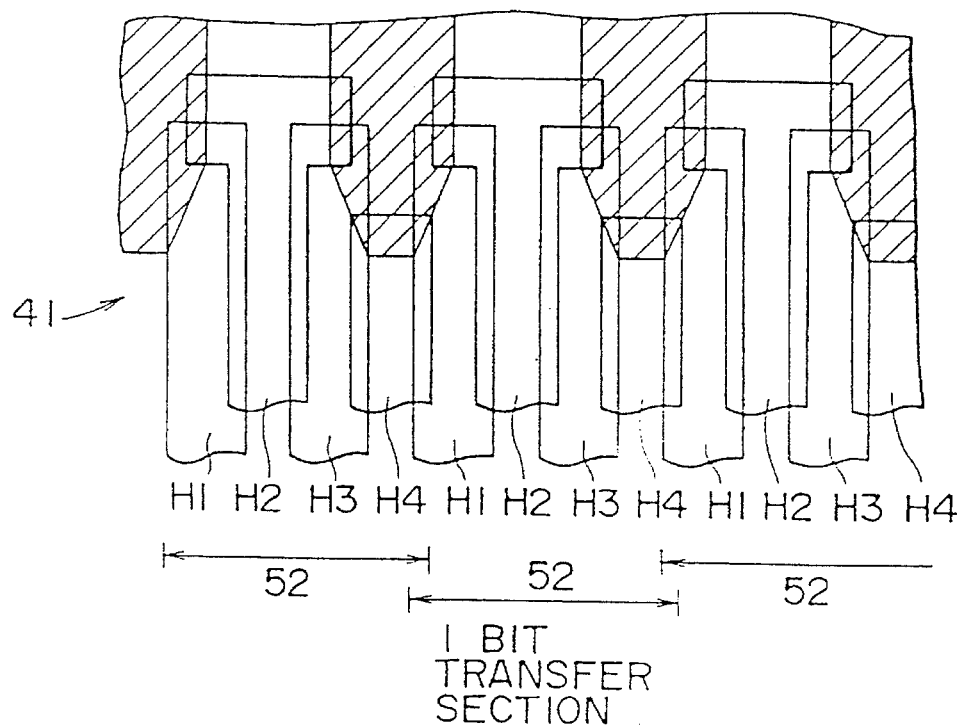
FIG. 12(a) is a diagrammatic view showing a pattern in plan of a horizontall charge transfer section of the conventional solid state imaging device shown in FIG. 11(b)
Figure 12B:
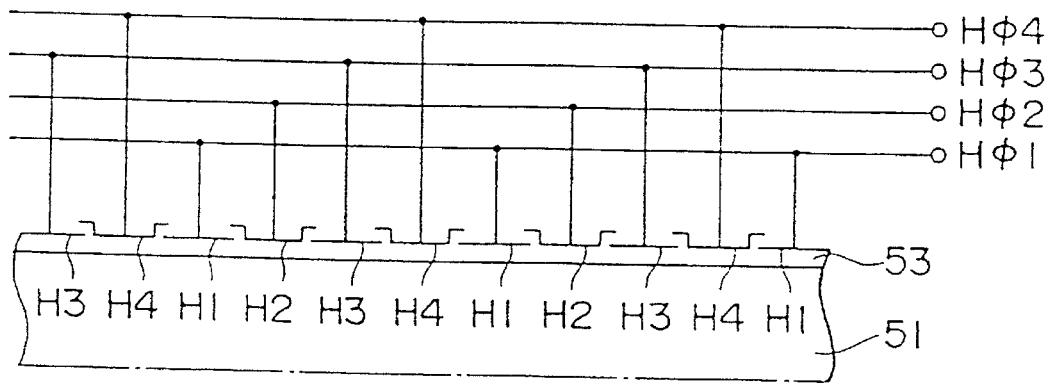
FIG. 12(b) is a diagrammatic view showing a sectional structure of the horizontal charge transfer section shown in FIG. 12(a)
Figure 13A:
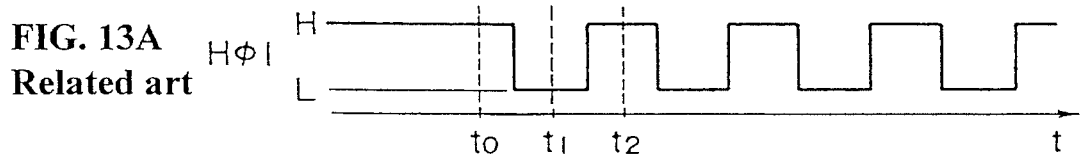
FIG. 13 is a waveform diagram showing waveforms of four horizontal transfer clocks in the conventional solid state imaging device shown in FIG. 11(b) when a regular image is to be outputted.
Figure 13B:
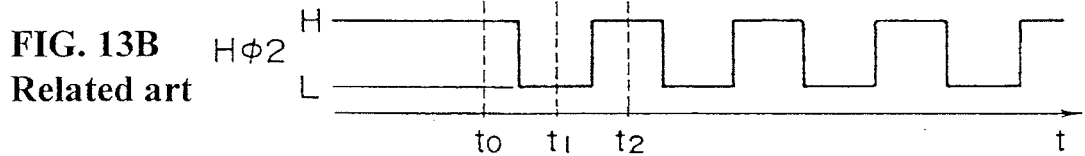
Figure 13C:
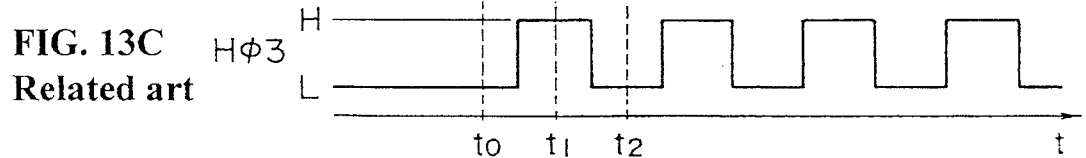
Figure 13D:
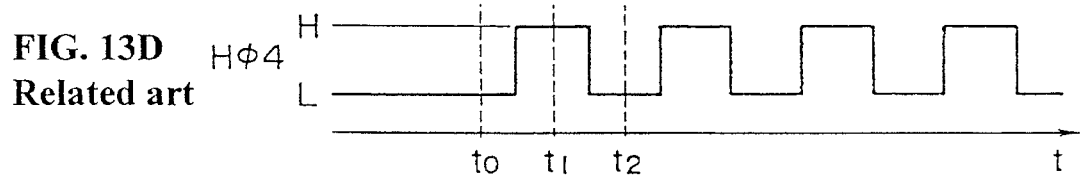
Figure 15A:
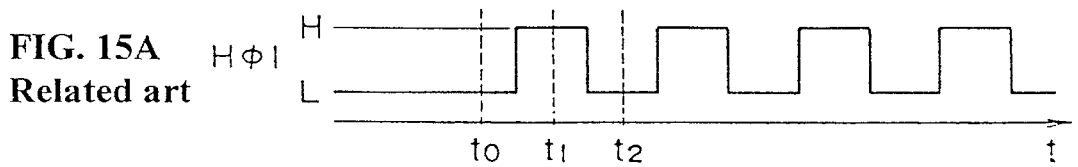
FIG. 15 is a waveform diagram showing waveforms of four horizontal transfer clocks in the conventional solid state imaging device shown in FIG. 11(b) when a mirror image is to be outputted.
Figure 15B:
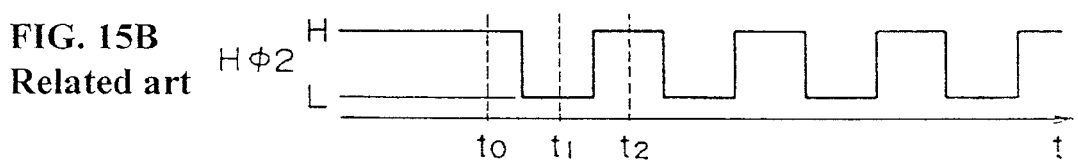
Figure 15C:
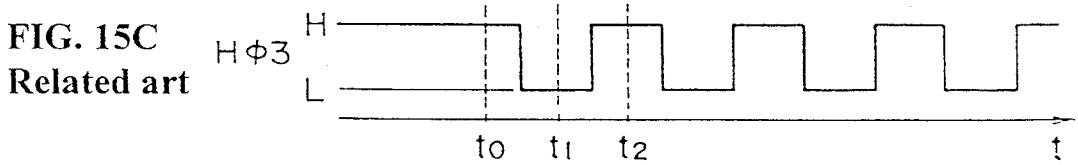
Figure 15D:
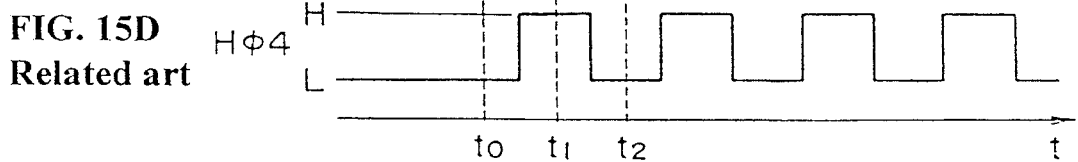
Figure 16A:
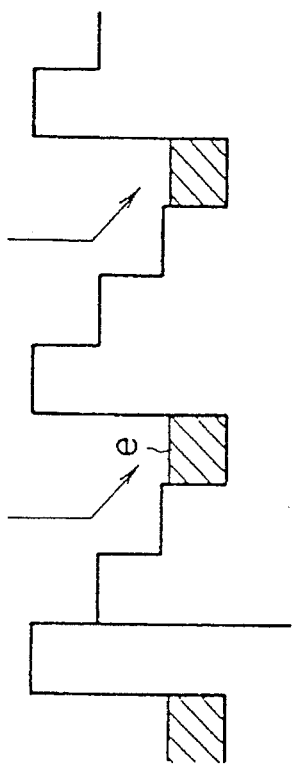
FIGS. 16(a) to 16(c) are potential diagrams illustrating transferring operation of the conventional solid state imaging device shown in FIG. 11(b) when a mirror image is to be outputted.
Figure 16B:
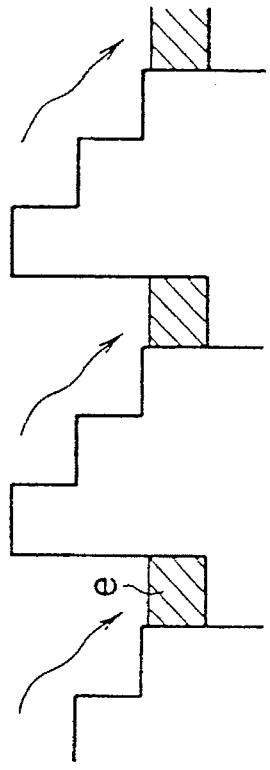
Figure 16C:
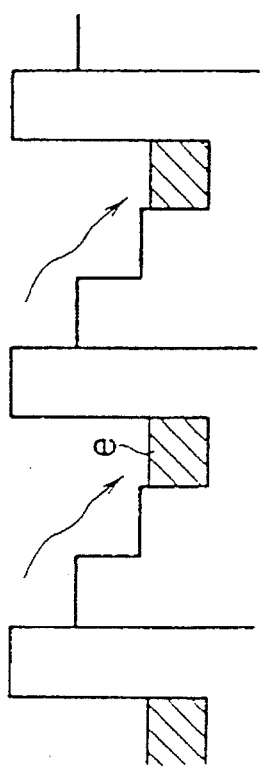

FIG. 10(a) shows another solid state imaging device to which the present invention is applied upon outputting of a regular image, and FIG. 10(b) shows the solid state imaging device of FIG. 10(a) but upon outputting of a mirror image.

The solid state imaging device of the present embodiment is a modification to the solid state imaging device of the first embodiment described hereinabove with reference to FIG. 1 in that, in each of the first and second output circuit sections 21 and 22 shown in FIG. 4, for example, the source follower circuit 25 at the third stage is used commonly for outputting a regular image and for outputting a mirror image.

In particular, when a regular image is to be outputted as seen in FIG. 10(a), the common source follower circuit 25 at the third stage is connected to the output terminal of the first charge detection section 17 by way of the source follower circuits 23 and 24 of the first and second stages of the first output circuit section 21 using an aluminum wiring line, and the output terminal of the source follower circuit 25 is connected to the output terminal 27 using another aluminum wiring line.

On the other hand, when a mirror image is to be outputted as seen in FIG. 10(b), the common source follower circuit 25 at the third stage is connected to the output terminal of the second charge detection section 18 by way of the source follower circuits 23 and 24 at the first and second stages of the second output circuit section 22 using an aluminum wiring line, and the output terminal of the source follower circuit 25 is connected to the output terminal 27 using another aluminum wiring line.

Since the last stage portions of the circuitry of the first and second output circuit sections 21 and 22 are made a common circuit, output circuit sections having a comparatively large circuit configuration can be employed for the first and second output circuit sections 21 and 22, and also the output terminals can be formed as a common terminal. Further, where the output terminal 27 is disposed in the proximity of the source follower circuit 25 of the last stage, occurrence of a propagation delay or production of a parasitic capacitance can be prevented.

It is to be noted that, while, in the present embodiment, the source follower circuits at the third stage of the first and second circuit sections 21 and 22 which are each constituted from source followers of three stages are formed as the common source follower circuit 25, it is otherwise possible to form the source follower circuits 24 at the second stage as a common circuit.

Further, where each of the first and second output circuit sections 21 and 22 is constituted from source followers of two stages, the source follower circuits at the second stage should be formed as a common circuit. Further, where each of the first and second output circuit sections 21 and 22 is constituted from source followers of four or more stages, the source follower circuits should be formed as a common circuit suitably from the last stage side.

Having now fully described the invention, it will be apparent to one of ordinary skill in the art that many changes and modifications can be made thereto without departing from the spirit and scope of the invention as set forth herein.

What is claimed is:

1. A process of manufacturing a solid state imaging device having either a regular image output or a mirror image output, comprising the steps of:

providing said solid state imaging device comprising an image section having a photoelectric transducer section in which a plurality of photoelectric transducer elements are linearly arranged, a horizontal charge transfer section connected to the image section, the horizontal charge transfer section further comprised of a plurality of transfer electrodes for horizontally transferring signal charge transferred thereto from said image section; and first and second charge detection sections provided at the opposite ends of said horizontal charge transfer section for detecting said signal charge horizontally transferred in said horizontal charge transfer section;

connecting groups of said plurality of transfer electrodes so that said signal charge is transferred to either the first charge detection section or the second charge detection section upon receiving a clock signal for driving said horizontal charge transfer section.

2. The process of manufacturing a solid state imaging device as claimed in claim 1, wherein said solid state imaging device further comprises a first output circuit section and a second output circuit section connected to a corresponding one of said first and second charge detection sections and wherein each of said first and second output circuit sections is comprised of a plurality of source follower circuits of two or more stages, and wherein said source follower circuits at a second or following stage being formed as a common source follower circuit common to said first and second output circuit sections.

3. The process of manufacturing a solid state imaging device of claim 1, wherein said plurality of transfer electrodes of said horizontal charge transfer section is comprised of four groups of electrodes, wherein electrodes of each of said four groups of electrodes are connected to other ones of said four electrodes in the group to effect horizontal transfer of charge by two-phase driving, and wherein the step of connecting comprises interconnecting ones of the four groups of electrodes to establish a connection relationship corresponding to said two-phase driving.

4. The process of manufacturing a solid state imaging device of claim 3, wherein said solid state imaging device is further comprised of four pad elements connected to individual members of said four groups of electrodes and wherein said step of connecting comprises interconnecting individual ones of said four pad elements.

5. The process of manufacturing a solid state imaging device of claim 1, wherein said image section is further comprised of first and second optical black areas, said first optical black area being located at a left side of the image section and said second optical black area being located at a right side of the image section.

6. The process of manufacturing a solid state imaging device of claim 1, wherein said plurality of photoelectric transducer elements are arranged in a matrix.

* * * * *